(12) United States Patent
Cho et al.

(10) Patent No.: US 6,242,332 B1
(45) Date of Patent: Jun. 5, 2001

(54) METHOD FOR FORMING SELF-ALIGNED CONTACT

(75) Inventors: Chang-Hyun Cho, Seoul; Tae-Young Chung; Ki-Nam Kim, both of Kyunggi-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/384,281

(22) Filed: Aug. 27, 1999

(30) Foreign Application Priority Data

Aug. 29, 1998 (KR) .................................. 98-35391

(51) Int. Cl.[7] .................. H01L 21/3205; H01L 21/4763
(52) U.S. Cl. ........................ 438/587; 438/588; 438/591
(58) Field of Search .................................. 438/238, 239, 438/241, 297, 303, 587, 588, 591, 622, 629

(56) References Cited

U.S. PATENT DOCUMENTS

| | | | | |
|---|---|---|---|---|
| 5,661,054 | * | 8/1997 | Kauffman et al. | 438/257 |
| 5,706,164 | * | 1/1998 | Jeng | 438/238 |
| 5,736,442 | * | 4/1998 | Mori | 438/257 |
| 5,763,303 | * | 6/1998 | Liaw et al. | 438/210 |
| 5,843,815 | * | 12/1998 | Liaw | 438/238 |
| 5,863,837 | * | 1/1999 | Sudo | 438/692 |
| 5,907,781 | * | 5/1999 | Chen et al. | 438/303 |
| 6,037,228 | * | 3/2000 | Hsu | 438/279 |
| 6,037,246 | * | 3/2000 | Bhat et al. | 438/618 |

OTHER PUBLICATIONS

S.P. Sim et al.; "A New Planar Stacked Technology (PST) for Scaled and Embedded Drams"; 1996 IEEE; pp. 597–600.
K.P. Lee et al.; "A Process Technology for 1 Giga–Bit DRAM"; 1995 IEEE; pp. 907–910.
Y. Kohyama et al.; "A Fully Printable, Self–Aligned and Planarized Stacked Capacitor DRAM Cell Technology for 1Gbit DRAM and Beyond"; 1997; pp. 17–18.

* cited by examiner

Primary Examiner—John F. Niebling
Assistant Examiner—Walter L. Lindsay, Jr.
(74) Attorney, Agent, or Firm—Jones Volentine, L.L.C.

(57) ABSTRACT

The size of a pad in the present invention is reduced, thereby preventing a polymer etch-stop, suppressing a short between a gate and a gate conductive layer exposed by the damage of an oxide layer covering the gate conductive layer, and extending a top surface area of a pad beyond the technical limitation of a photo equipment. As a result, it is possible to greatly secure the alignment of a buried contact electrically connected to the pad.

14 Claims, 14 Drawing Sheets

US 6,242,332 B1

METHOD FOR FORMING SELF-ALIGNED CONTACT

This application relies for priority upon Korean Patent Application No. 98-35391, filed on Aug. 29, 1999, the contents of which are herein incorporated by reference in their entirety.

FIELD OF THE INVENTION

The present invention relates to a method for fabricating a semiconductor device, and more particularly to a method for forming a self-aligned contact in a semiconductor device.

BACKGROUND OF THE INVENTION

As semiconductor components have been become more finely structured, dynamic random access memory (DRAM) sizes have moved toward gigabits of storage capacity. In such a gigabit DRAM, components are formed to have a critical dimension of 0.18 μm or less, which reduces the size of a contact hole connecting component-to-component or layer-to-layer and also reduces the alignment margin for the device.

In order to reduce the size of a contact hole formed through a photolithography process and to increase the alignment exactitude on a photo equipment, a self-aligned contact is suggested.

The self-aligned contact process may increase the alignment margin and reduce the contact resistance. Accordingly, the self-aligned contact is regarded as one of the important methods for forming a contact.

A conventional method for forming a self-aligned contact will be described below with reference to FIGS. 1, 2A, and 2B. FIG. 1 is a top plan view showing a structure of a self-aligned contact according to a conventional method. FIGS. 2A–2B are sectional views sequentially showing the process steps of a conventional method for forming a self-aligned contact, taken along a line II–II' of FIG. 1.

Referring to FIG. 2A, a device isolation layer 12, defining an active region 10b and an inactive region, is formed in a semiconductor substrate 10a. The device isolation layer 12 is formed through a conventional local oxidation of silicon (LOCOS) process or shallow trench isolation (STI) process.

After the formation of a gate oxide layer (not shown) over the semiconductor substrate 10a, a conductive layer (not shown), to be used as a gate electrode, and an insulating layer (not shown), to be used as a gate mask, are sequentially formed over the gate oxide layer. The insulating layer may, for example, be made of SiN having an etch selectivity with respect to an interlayer insulating film formed through the following process. The conductive layer may be a dual layer including a polysilicon layer and a tungsten silicide layer.

The conductive layer and the insulating layer are then patterned using a conventional photolithography process to form a gate mask 18 and gate electrodes 14 and 16. In this case a dual polysilicon layer and tungsten silicide layer are used for a conductive layer, so the resulting gate electrode 14 and 16 includes a polysilicon gate electrode portion 14 and a tungsten silicide gate electrode portion 16. For ease of disclosure, these two portions will simply be referred to as the gate electrode 14 and 16.

In order to form a lightly doped drain (LDD) structure, a low concentration source/drain impurity ion is implanted into the active region 10b at both sides of the gate electrode 14 and 16. A gate spacer 20 is then formed on both sidewalls of the gate electrode 14 and 16 and the gate mask 18. The gate spacer may be made of, for example, SiN having an etch selectivity with respect to an interlayer insulating film 22 formed through the following process. A high concentration source/drain impurity ion may be implanted into the active region 10b at both sides of the gate spacer, a transistor is completed.

The interlayer insulating film 22 is then formed over the semiconductor substrate 10a. Using a photoresist pattern (not shown) for a self-aligned contact, the interlayer insulating film 22 is then etched to form openings 24a.

Referring to FIG. 2B, after the removal of the photoresist pattern, a polysilicon layer is formed over the interlayer insulating film 22 and filling the openings 24a. The polysilicon layer is planarized down to a top surface of the interlayer insulating film 22 through an etch-back process or a chemical mechanical polishing (CMP) process, so that self-aligned contact pads 24b and 24c are formed. The contact pad 24b is electrically connected to a later-formed bit line, and the contact pad 24c is electrically connected to a later-formed capacitor lower electrode.

As the minimum design rule of a current memory cell structure is reduced, a method for forming a source/drain contact for connecting a bit line and storage node in a cell has become increasingly difficult. As shown in FIG. 2A, in the foregoing prior method, the width W of the interlayer insulating film 22 between the contact holes 24a becomes narrower in more highly-integrated components. Owing to the limitation of the photolithography technique for forming the contact holes 24a, it becomes increasingly difficult to form a photoresist pattern in highly-integrated devices.

IEDM 95, p. 907 and IEDM 96, p. 597, the disclosures of which are incorporated by reference in their entirety, disclose a self-aligned contact process.

Generally, as shown in FIG. 1, the typical shape of the self-aligned contact is of a circular or elliptical configuration. As a pattern size is reduced in this method (i.e., as a contact hole size is reduced), an area etched during an etching process is also reduced and a contact hole becomes relatively deep (i.e., high aspect ratio). As a result, a so-called "etch-stop" may be generated. In other words, the etching speed is reduced and, if severe enough, an etching byproduct, such as a polymer, cannot easily diffuse out of the deep and narrow contact hole, and the etching can stop in a severe case (using a so called "etching stop phenomenon").

In order to solve the problems, it is necessary to etch on condition of suppression of generating a polymer or to increase the etching time. However, the etch selectivity of a silicon nitride capping layer and spacer with respect to an interlayer insulating film is reduced under this condition, so that the interlayer insulating film is not selectively etched to lose the original objects of the self-aligned contact.

Based on this, Y. Kohayma et al. have suggested a new structure in which a contact hole for a a bit line pad and a lower capacitor electrode pad is united ("A Fully Printable, Self-aligned and Planarized Stacked Capacitor DRAM Cell Technology for 1 Gbit DRAM and Beyond", symp. on VLSI tech. digest of technical papers, pp. 17–18, 1997).

In this design, however, a pattern area occupied by the photoresist is so small in the foregoing circular or elliptical configuration structure that the polymer is less formed during an etching process for forming the contact hole. The polymer may alter etching speed and etch selectivity with respect to the interlayer insulating film. If the photoresist pattern area is great enough, the etch selectivity may increase.

SUMMARY OF THE INVENTION

It is therefore an object of the present invention to provide a method for forming a self-aligned contact capable of preventing an etch-stop phenomenon according to the increase of the aspect ratio of a contact hole and still more securing misalignrment to a buried contact electrically connected to a pad.

According to the object of the present invention, a method is provided for forming a self-aligned contact of a semiconductor device. The method includes forming a conductive layer over a semiconductor substrate, forming a first multiple insulating layer over the conductive layer, the first multiple insulating layer including a first insulating layer and a second insulating layer that has an etching selectivity with respect to the first insulating layer, forming a second multiple insulating layer over the first multiple insulating layer, the second multiple insulating layer including a third insulating layer and a fourth insulating layer, the third insulating layer having an etching selectivity with respect to both the second and fourth insulating layer, forming a plurality of gate electrodes by etching the conductive layer, the first multiple insulating layer, and the second multiple insulating layer using a gate electrode formation mask, forming a spacer on gate sidewalls of the gate electrode, the spacer having an etch selectivity with respect to the fourth insulating layer, forming an interlayer insulating layer over the semiconductor substrate to fill spaces between the gate electrodes, the interlayer insulating layer having a etching selectivity with respect to the third insulating layer, etching the interlayer insulating layer until a top surface of the semiconductor substrate between the gate electrodes is exposed, to form an opening, forming a conductive layer over the interlayer insulating layer and in the opening, and planarizing the conductive layer to form a pad.

The method preferably further comprises forming a fifth insulating layer over the semiconductor substrate and the gate electrodes subsequent to the forming of the spacer, using a pad formation mask and etching the interlayer insulating layer until the fifth insulating layer over the semiconductor substrate and adjacent to the gate electrode is exposed. Preferably, the etching of the insulating layer until a top surface of the semiconductor substrate between the gate electrodes is exposed includes: etching the fourth and fifth insulating layers and the a portion of the sidewall spacer, and etching a portion of the sidewall spacer exposing a lateral surface of the third insulating layer. The planarizing of the conductive layer is preferably performed down to a top surface of the third insulating layer.

The etching the interlayer insulating layer until a top surface of the semiconductor substrate between the gate electrodes is exposed may also include: etching the fourth and fifth insulating layers, etching an upper portion of the spacer to expose sidewalls of the first and second multiple insulating layers, and isotropically etching sidewall portions of the exposed second insulating layer to cause an undercut portion between the first and third insulating layers. In this case, the planarizing of the conductive layer is preferably performed until a top surface of the second insulating layer is exposed.

The first and third insulating layers preferably comprise SiN, and the second and fourth insulating layers preferably comprise an oxide. The first insulating layer preferably has a thickness of about 500 to 1,000 Å, the second insulating layer preferably has a thickness of about 500 to 1,000 Å, the third insulating layer preferably has a thickness of about 500 to 700 Å, and the fourth insulating layer preferably has a thickness of about 300 to 500 Å. The pad formation mask is preferably T-type.

The spacer preferably comprises SiN and has a thickness of about 300 to 1,000 Å from a sidewall of the gate electrode.

The isotropic etching of the second insulating layer is preferably performed until the minimum thickness of the second insulating layer is left to insulate the pad from an adjacent pad. The minimum thickness of the second insulating layer is preferably about 400 Å.

In the alternative, a method is provided for forming a self-aligned contact of a semiconductor device, which method comprises forming a conductive layer over a semiconductor substrate, forming a first insulating layer over the conductive layer, forming a second insulating layer over the first insulating layer, forming a third insulating layer over the second insulating layer, forming a fourth insulating layer over the third insulating layer, forming a gate electrode by etching the conductive layer and the first through fourth insulating layers, forming a spacer on sidewalls of the gate electrode, forming a fifth insulating layer over the semiconductor substrate, the gate electrode, and the spacer, forming an interlayer insulating film over the fifth insulating layer to fill a space between the gate electrode and an adjacent gate electrode, etching the interlayer insulating layer and the fifth insulating layer between the gate electrode and the adjacent gate electrode to form an opening exposing the semiconductor substrate, wherein an upper portion of the spacer is etched to expose sidewalls of the first and second multiple insulating layer, and sidewall portions of the exposed second insulating layers are isotropically etched to cause an undercut portion between the first and second insulating layers, forming a conductive layer over the interlayer insulating film and in the opening, and forming a pad by planarizing the conductive layer down to remove any portion outside of the opening.

As a result, of these methods, although the aspect ratio of a contact hole increases, a so-called etch-stop phenomenon is not generated. Moreover, it is possible to secure a misalignment margin to a buried contact electrically connected to a pad.

BRIEF DESCRIPTION OF THE DRAWINGS

The present invention will be more clearly understood from the description as set forth below, in comparison with the prior art with reference to the accompanying drawings, in which.

DETAILED DESCRIPTION OF PREFERRED EMBODIMENTS

The preferred embodiments of the present invention will be more apparently understood with reference to the following description and accompanying drawings.

First Preferred Embodiment

FIGS. 3A–3H are sectional views sequentially showing a method for fabricating a dynamic random access memory (DRAM) device according to a first preferred embodiment of the present invention. FIGS. 4A–4H are top plan views showing a method for fabricating a DRAM device according to the first preferred embodiment of the present invention, and corresponding to FIGS. 3A–3H, respectively.

Figure 3A:
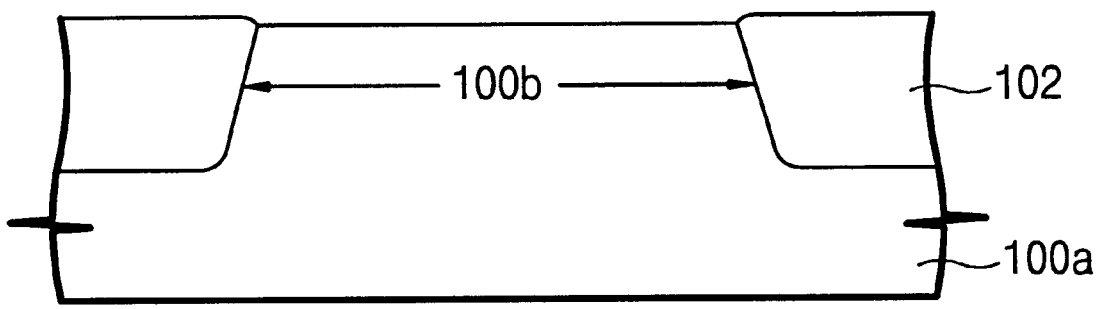
FIGS. 3A–3H are sectional views sequentially showing a method for fabricating a dynamic random access memory (DRAM) device according to a first preferred embodiment of the present invention.
Figure 4A:
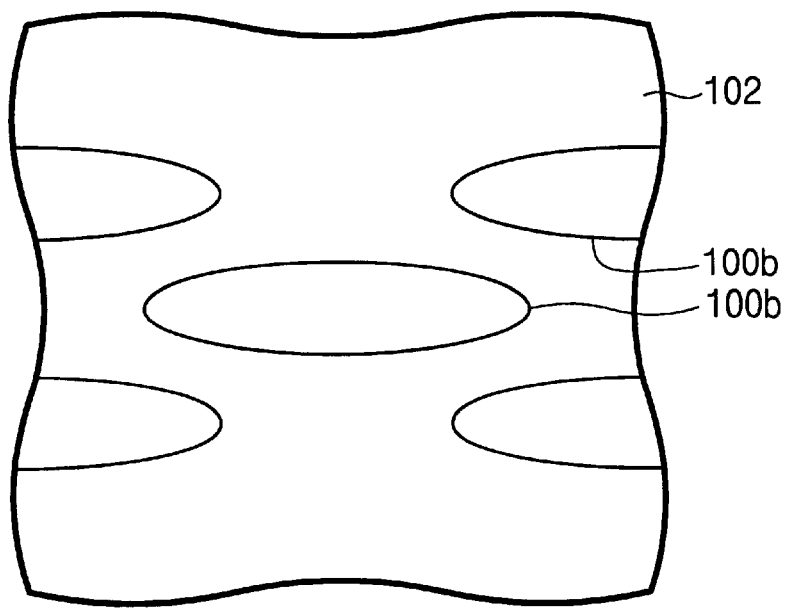
FIGS. 4A–4H are top plan views showing a method for fabricating a DRAM device according to the first preferred embodiment of the present invention, and corresponding to FIGS. 3A–3H, respectively.

Referring to FIG. 3A and FIG. 4A, a device isolation region 102 defining an active region 100b is formed in a semiconductor substrate 100a. The device isolation region 102 may be formed, for example, via a shallow trench isolation (STI) technique. Since the STI technique is well-known in the art, its explanation is omitted. Other suitable techniques may also be used to define an active region 100b. After defining the active region 100b, a gate oxide layer (not shown) is grown on the semiconductor substrate 100a.

Figure 3B:
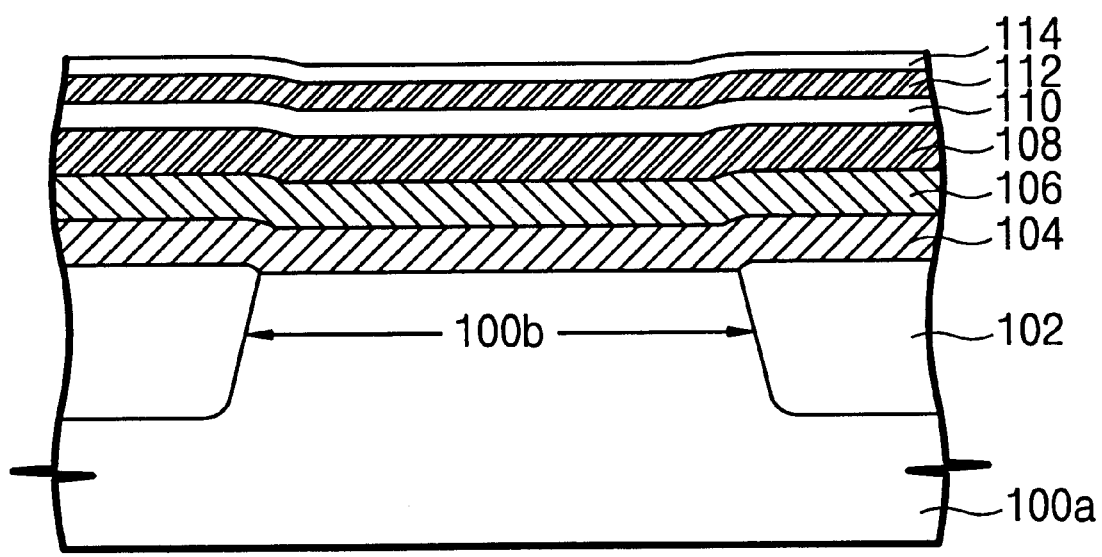
Figure 4B:
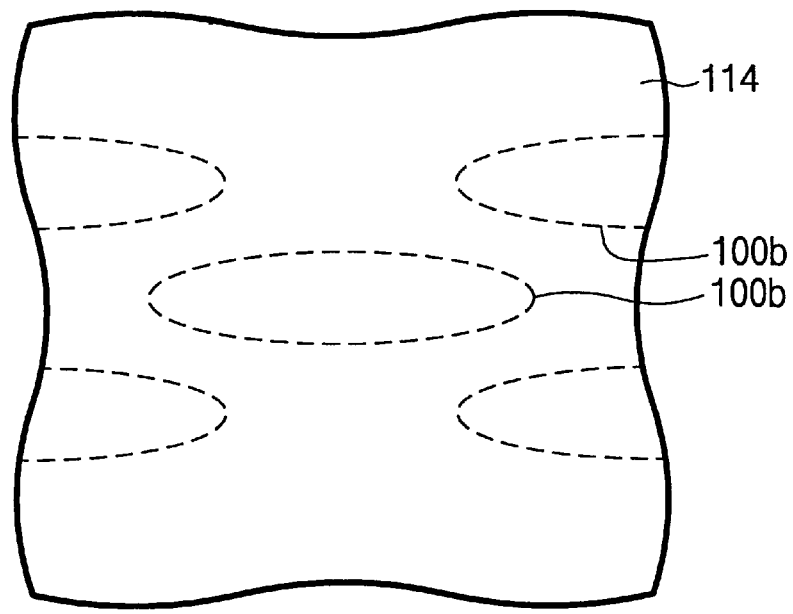

Referring to FIG. 3B and FIG. 4B, a conductive layer, a first multiple insulating layer, and a second multiple insulating layer are formed over the gate oxide layer. In this embodiment, the conductive layer comprises first and second gate conductive layers 104 and 106; the first multiple insulating layer comprises first and second insulating layers 108 and 110, and the second multiple insulating layer comprises third and fourth insulating layers 112 and 114.

Preferably, the first gate conductive layer 104 comprises polysilicon having a thickness of about 1,000 Å and the second gate conductive layer 106 comprises tungsten silicide having a thickness of about 1,000 Å.

In the first and second multiple insulating layers, two different layers having an etching selectivity with respect to each other are alternately deposited. More specifically, the two different layers are preferably an oxide layer and a nitride layer. Initially, a first nitride layer 108 (a first insulating layer) is deposited over the second gate conductive layer 106, and then a first oxide layer 110 (a second insulating layer) is deposited over the first nitride layer 108. Then a second nitride layer 112 (a third insulating layer) is then deposited over the first oxide layer 110, and a second oxide layer (a fourth insulating layer) is deposited over the second nitride layer 112. The first and third insulating layers 108 and 112 preferably comprise SiN and the second and fourth insulating layer 110 and 114 preferably comprise an oxide such as PE-TEOS (plasma-enhanced tetraethylorthosilicate), HDP (high density plasma), HTO (high temperature oxide), and USG (undoped silicon glass).

In the first multiple insulating layer, which comes in contact with the gate conductive layer 106, the first insulating layer 108 preferably has a thickness of about 500 to 1,000 Å and the second insulating layer 110 preferably has a thickness of about 500 to 1,000 Å. In the second multiple insulating layer, the third insulating layer 112 preferably has a thickness of about 500 to 700 Å and the fourth insulating layer 114 preferably has a thickness of about 500 Å. Most preferably, an HTO layer is used as the fourth insulating layer 114 in the first and second preferred embodiments.

Figure 3C:
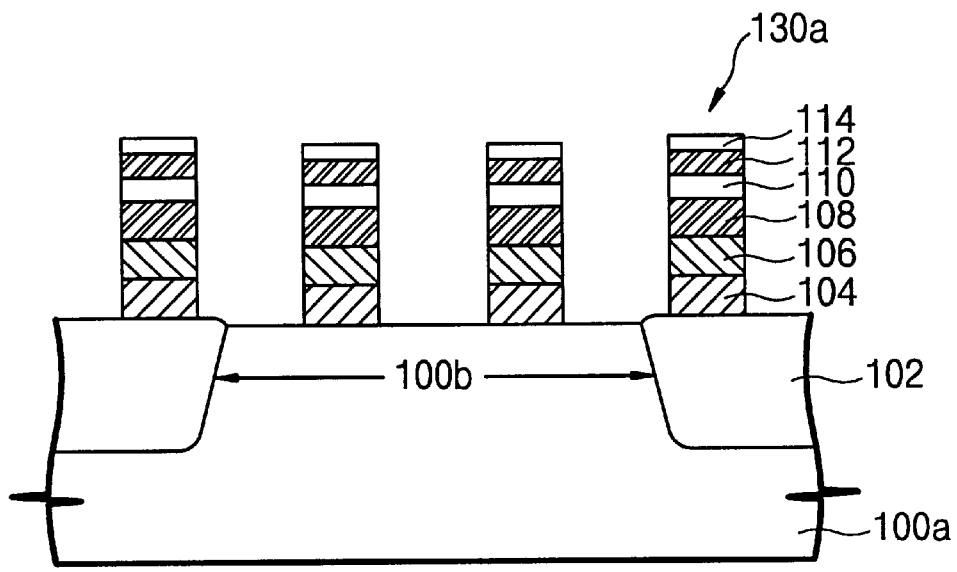
Figure 4C:
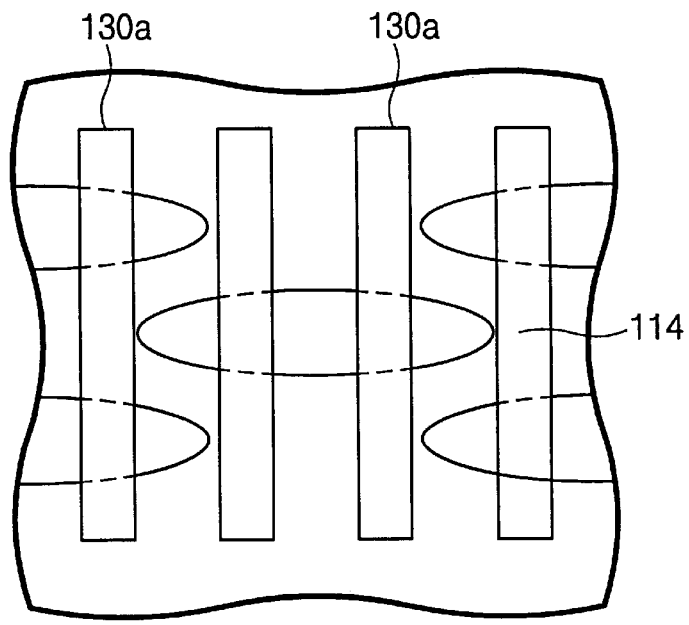

Referring to FIG. 3C and FIG. 4C, a photoresist layer (not shown) is formed over the fourth insulating layer 114. The photoresist layer is patterned through a photolithography process, and a photoresist pattern (not shown) is formed that defines a gate electrode formation region. Using the photoresist pattern as a mask, the first through fourth insulating layers 108, 110, 112, and 114 and the gate conductive layers 106 and 104 are sequentially etched to form a gate electrode 130a. The width of the gate electrode 130a is preferably about 1,000 Å.

Figure 3D:
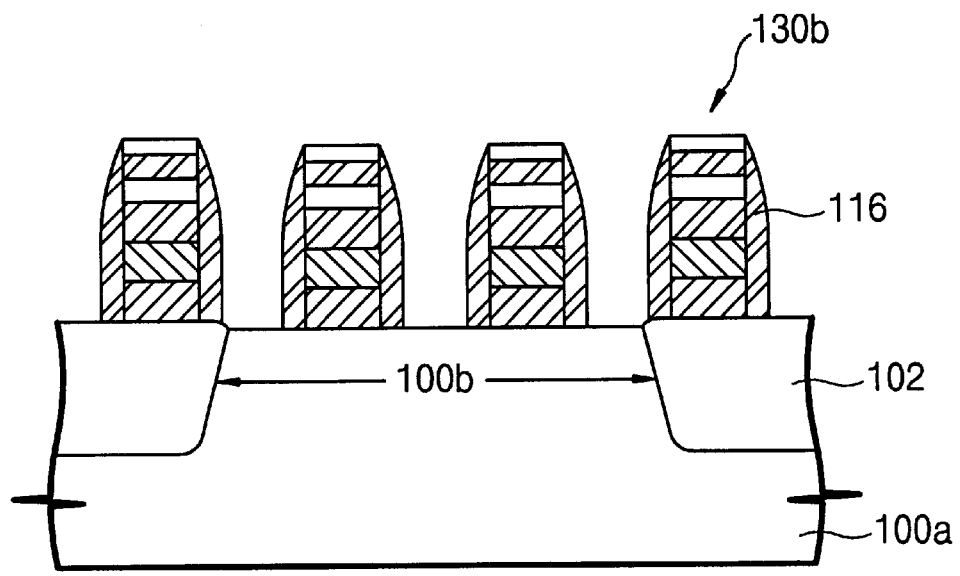
Figure 4D:
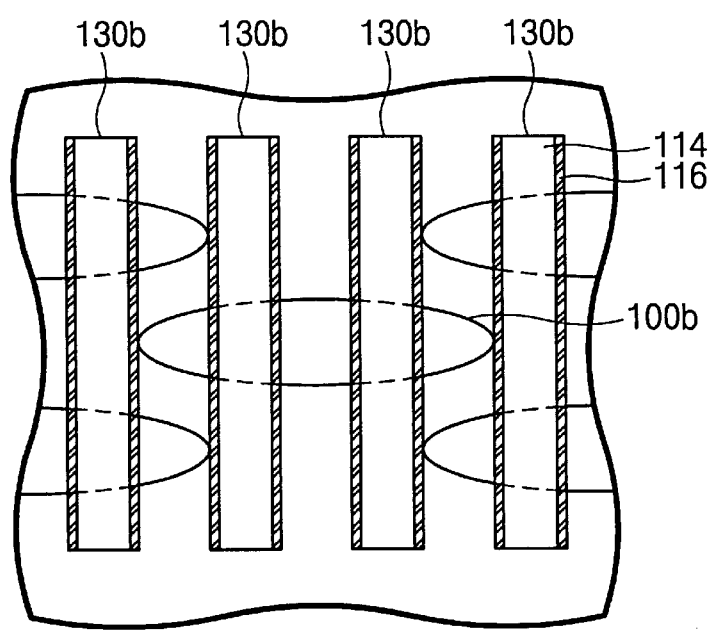

Referring to FIG. 3D and FIG. 4D, a first nitride layer (not shown), used for a sidewall spacer, is formed over the semiconductor substrate 100a including the gate electrodes 130a, preferably to a thickness of about 300 to 1,000 Å, more preferably to a thickness of about 500 Å. This first nitride layer, used as a sidewall spacer, may be, e.g., an SiN layer. The first nitride layer is anisotropically etched such that a spacer 116 is formed on both sidewalls of the electrode, preferably with a thickness of about 300 to 1,000 Å, more preferably with a thickness of about 500 Å. As a result, a gate 130b including the gate electrode 130a and the spacers 116 is formed. Before and/or after the formation of the spacers 116, an ion implanting process is performed to form a source/drain region (not shown) in the semiconductor substrate 100a on both sides of the gate 130b.

Figure 3E:
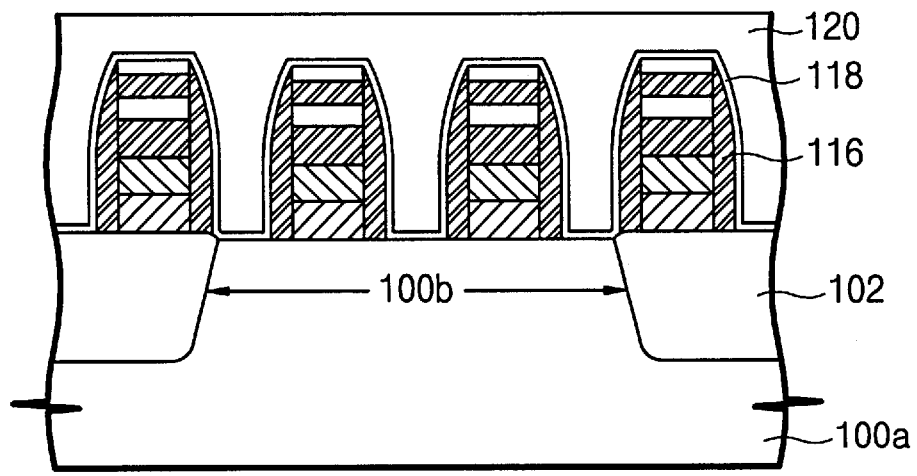
Figure 4E:
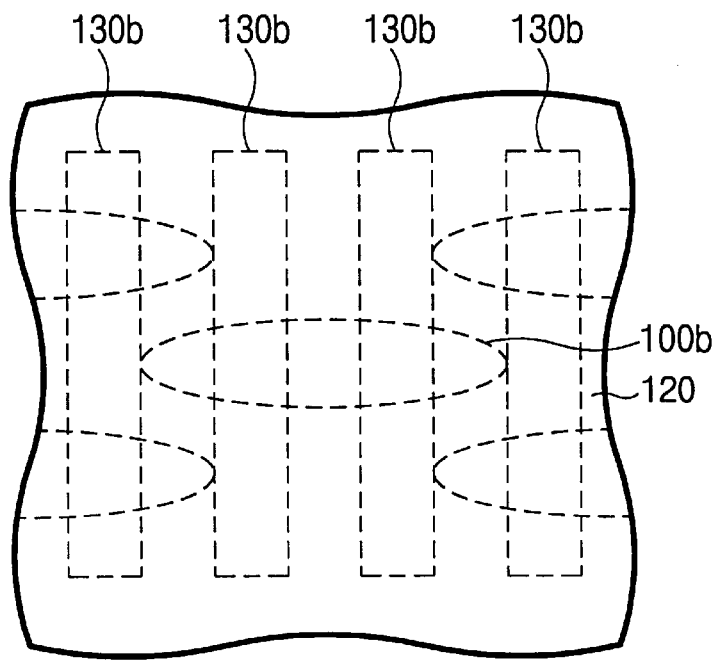

Referring to FIG. 3E and FIG. 4E, a second nitride layer 118 (e.g., an SiN layer) is formed over the semiconductor substrate 100a and the gates 130b. When etching an interlayer insulating film formed through the following process, the second nitride layer 118 may prevent the damage of the device isolation 102 region and the active region 100b.

An interlayer insulating film 120 is then formed over the semiconductor substrate 100a, the gates 130b, and the second nitride layer 118. The interlayer insulating film 120 is planarized, preferably through a chemical mechanical polishing (CMP) process or an etch-back process. The interlayer insulating film 120 is preferably made of oxide with a thickness of about 3,000 to 9,000 Å, more preferably, about 5,000 Å. After the CMP process, the interlayer insulating film 120 is left on the uppermost portion of the gate (that is, the fourth insulating layer 114), preferably with a thickness of about 500 to 1,000 Å.

Figure 3F:
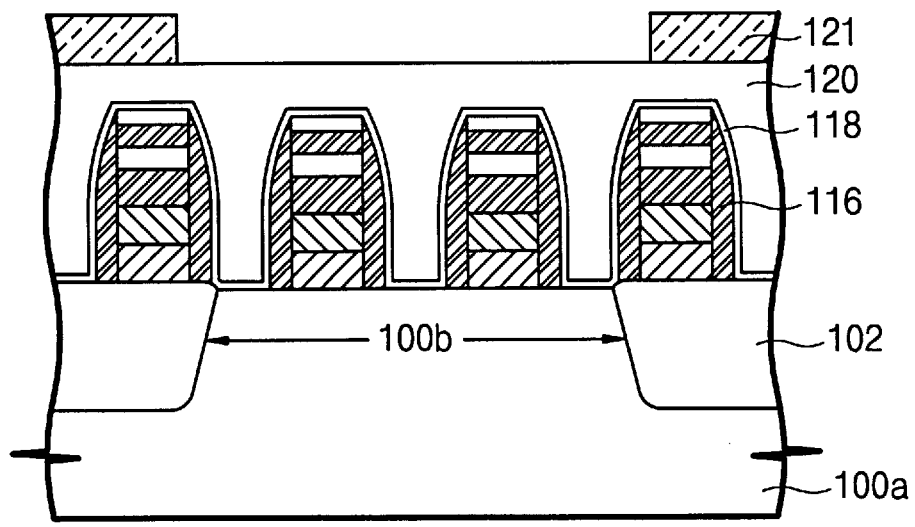
Figure 4F:
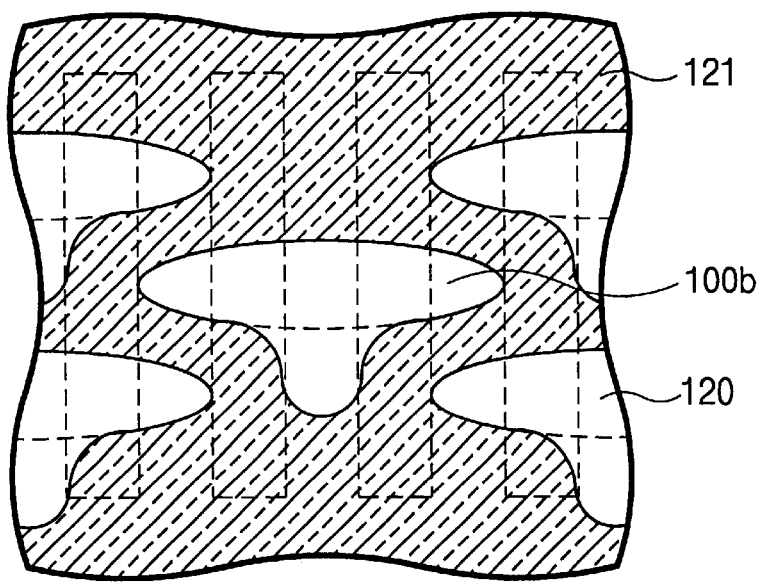

Referring to FIG. 3F and FIG. 4F, a photoresist layer (not shown) is formed over the interlayer insulating film 120. Afterward, the photoresist layer is patterned through a photolithography process to form a photoresist pattern 121 defining a pad formation region. The photoresist pattern 121 is preferably T-shaped and exposes a portion of the interlayer insulating film 120. The photoresist pattern 121 simultaneously exposes a bit line contact area and a capacitor lower electrode area.

Figure 3G:
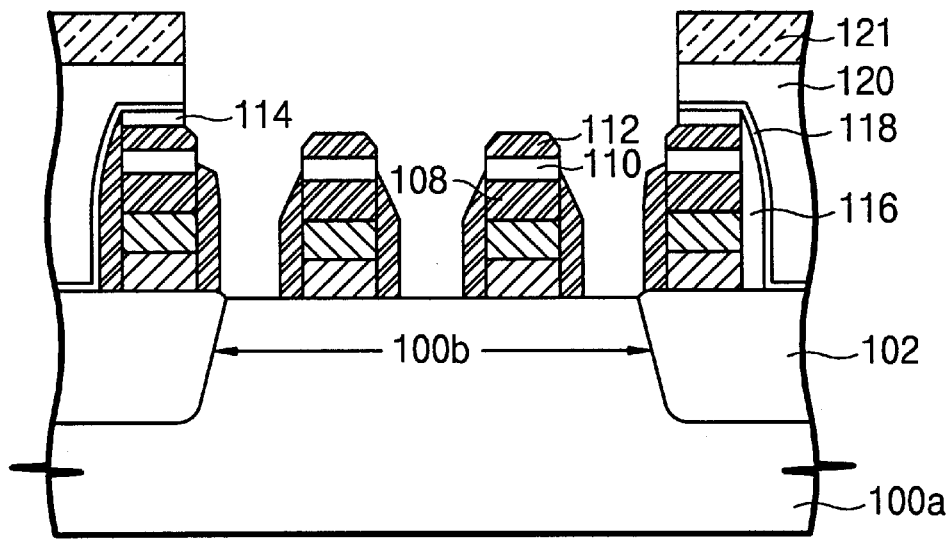
Figure 4G:
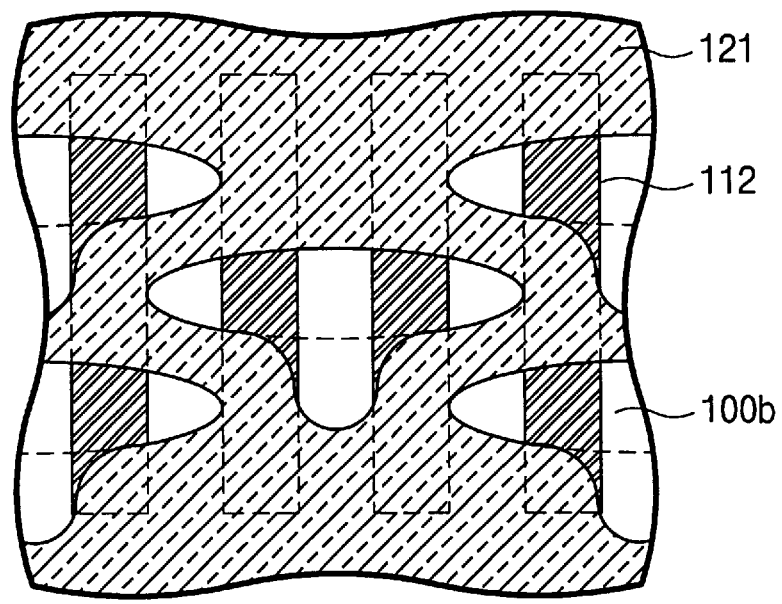

Referring to FIG. 3G and FIG. 4G, using the photoresist pattern 121 as a mask, the interlayer insulating film 120 is etched to form a pad formation opening. For better understanding as to this process, it will be described in more detail below with reference to FIGS. 5A–5C, which subdivide this process.

Figure 5A:
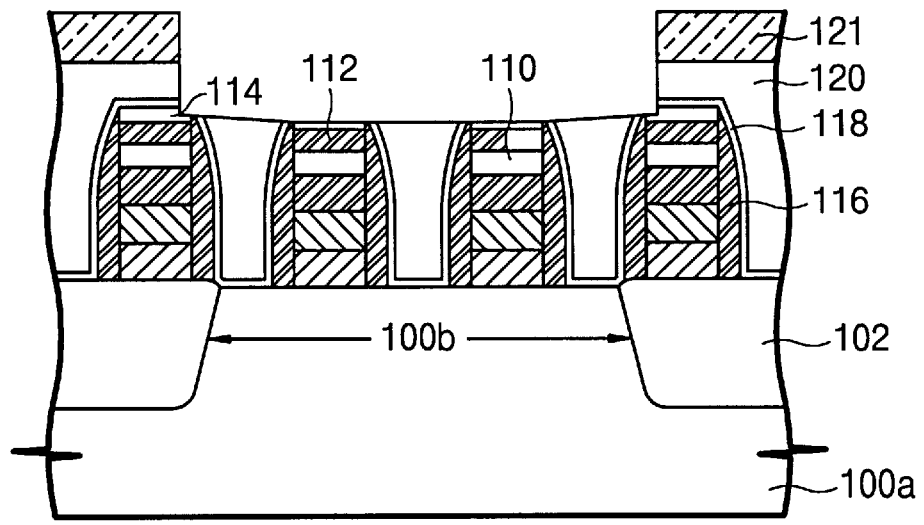
FIGS. 5A–5C are sectional views showing subdivided process steps that illustrate how the structure of FIG. 3G is formed from the structure of FIG. 3F.

As shown in FIG. 5A, the interlayer insulating film 120 on the uppermost portion of the gate and the fourth insulating layer 114 on the uppermost portion of the gate electrode are vertically etched with an etching selectivity with respect to the nitride spacer 116 according to the sidewall of the photoresist pattern 121. Since an upper portion of a spacer 116 has an etch selectivity with respect to the fourth insulating layer 114, the fourth insulating layer 114 only thinly remains, when the etching is performed.

Figure 5B:
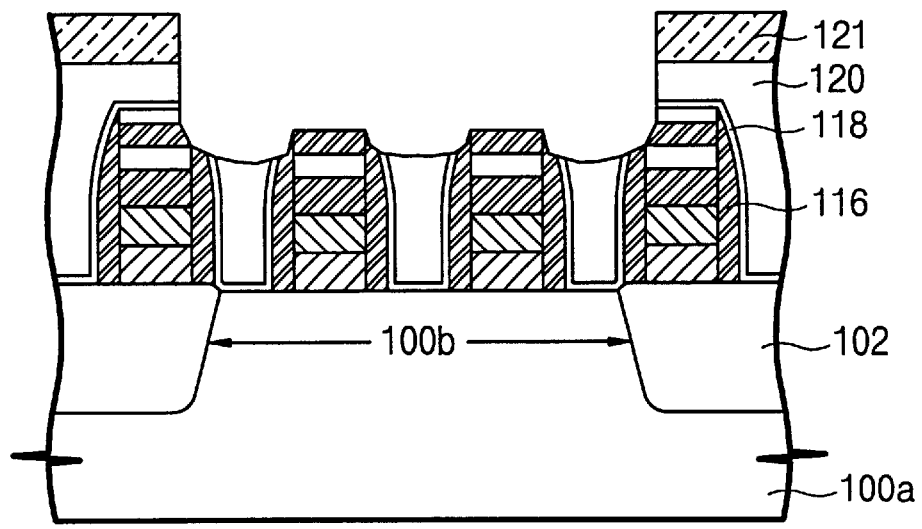

As shown in FIG. 5B, after etching the exposed thin fourth insulating layer 114, the third insulating layer 112 and the spacer 116 are exposed. The third insulating layer 112 and the spacer 116 are not well etched through an etching process of the interlayer insulating film 120 and the fourth insulating layer 114 (preferably made of an oxide). It is, however, inevitable to partially etch the edge portion of the third insulating layer 112 and the spacer 116.

Figure 5C:
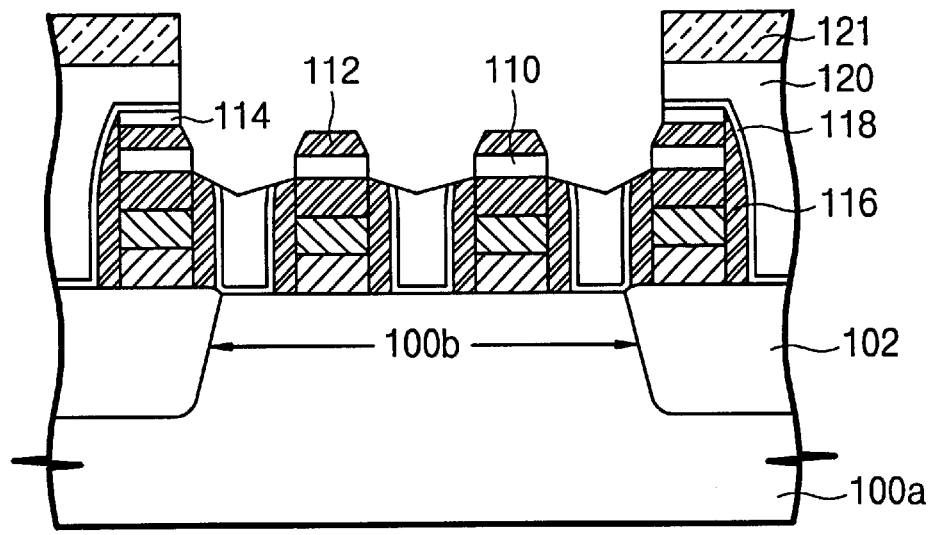

Having the same etch selectivity as the interlayer insulating film 120 of oxide during the etching process, the second insulating layer 110 of oxide is etched to be vertical to the photoresist pattern 121, as shown in FIG. 5C. A portion of the spacer 116 on both sidewalls of the second insulating layer 110 of the first multiple insulating layer contacted with the gate conductive layer 106 is etched simultaneously. The interlayer insulating film 120 is continuously etched and the first insulating layer 108 of the first multiple insulating layer contacted with the first and second gate conductive layers 104 and 106 is exposed.

All of the interlayer insulating films between the gates are etched down to a top surface of the foregoing second nitride layer 118. Since the thickness of the first insulating layer 108 is greater than that of the third insulating layer 112 or the fourth insulating layer 114, the first insulating layer remains together with the lower portion of the sidewall spacer and protects the gate electrodes.

The exposed second nitride layer 118 is then etched through a conventional residue-etch process, and an opening is formed to expose a top surface of the active region 100b of the semiconductor substrate 100a between the gates, as shown in FIG. 3G.

Figure 3H:
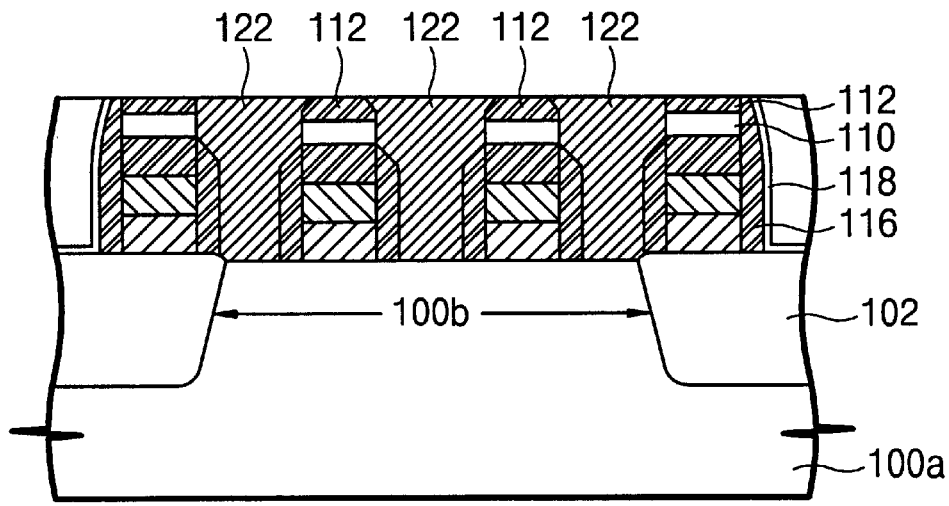
Figure 4H:
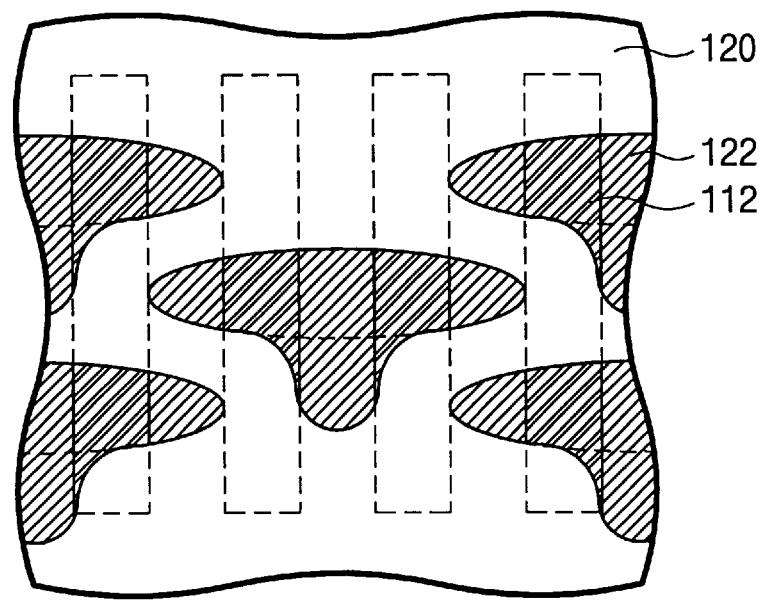

Referring to FIG. 3H and FIG. 4H, the photoresist pattern 121 is then removed. In order to fill up the opening, a conductive layer (not shown) is then formed over the interlayer insulating film 120, including the opening, preferably to a thickness of about 3,500 to 5,000 Å. This conductive layer may be formed e.g., out of polysilicon. Through the CMP process using the third insulating layer 112 of the gate as an etch-stop layer, the undesirable polysilicon layer is removed to form a pad 122 electrically separated by the gate.

Second Preferred Embodiment

Figure 6A:
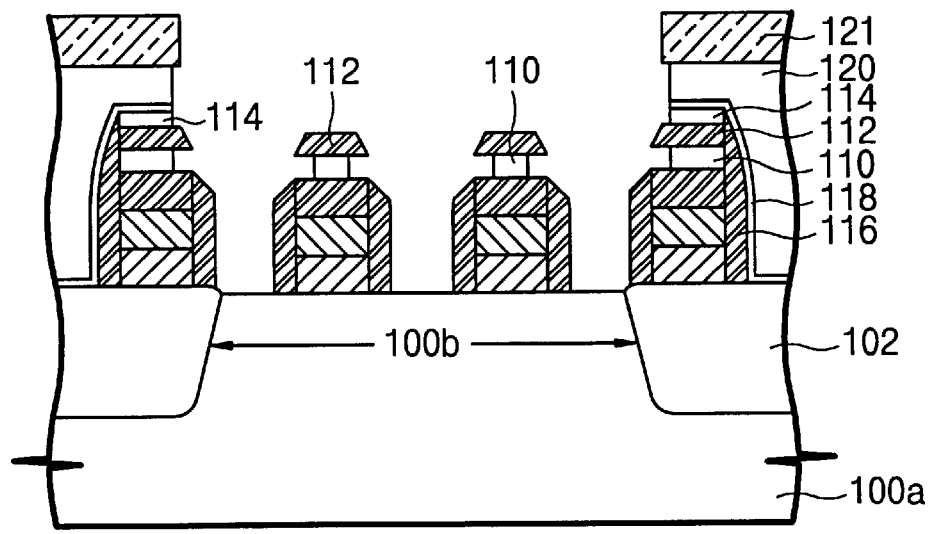
FIGS. 6A–6C are sectional views sequentially showing a method for fabricating a DRAM device according to a second preferred embodiment of the present invention.
Figure 6B:
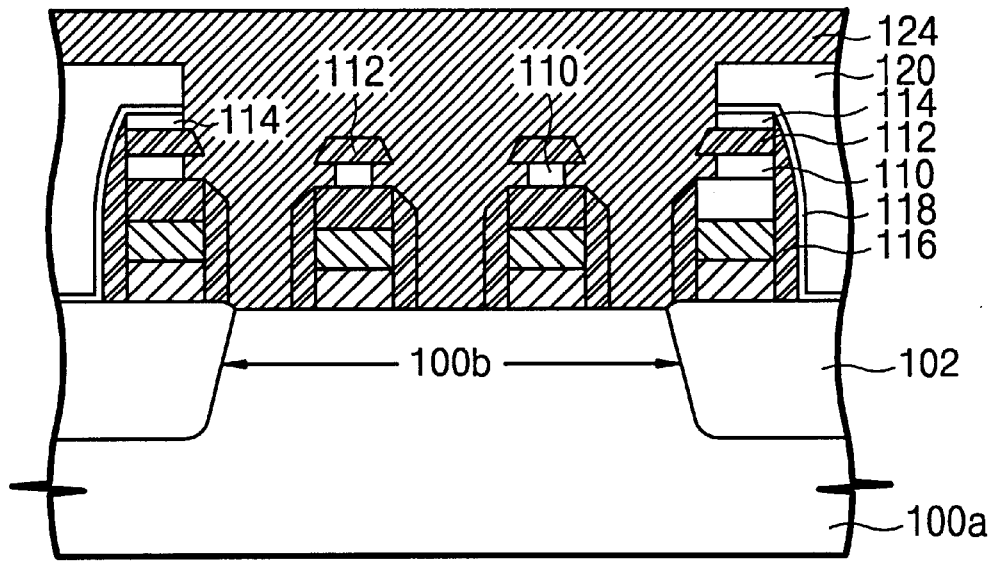
Figure 6C:
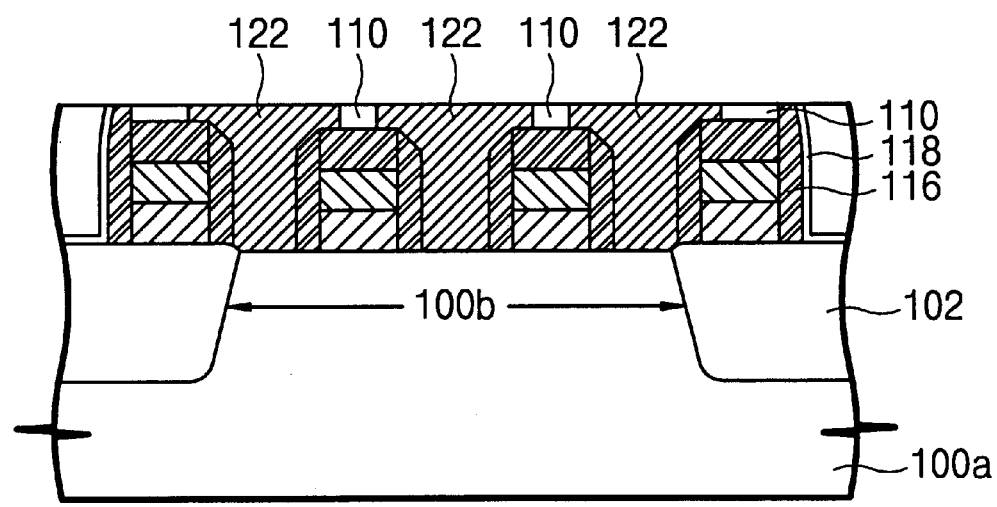
Figure 7:
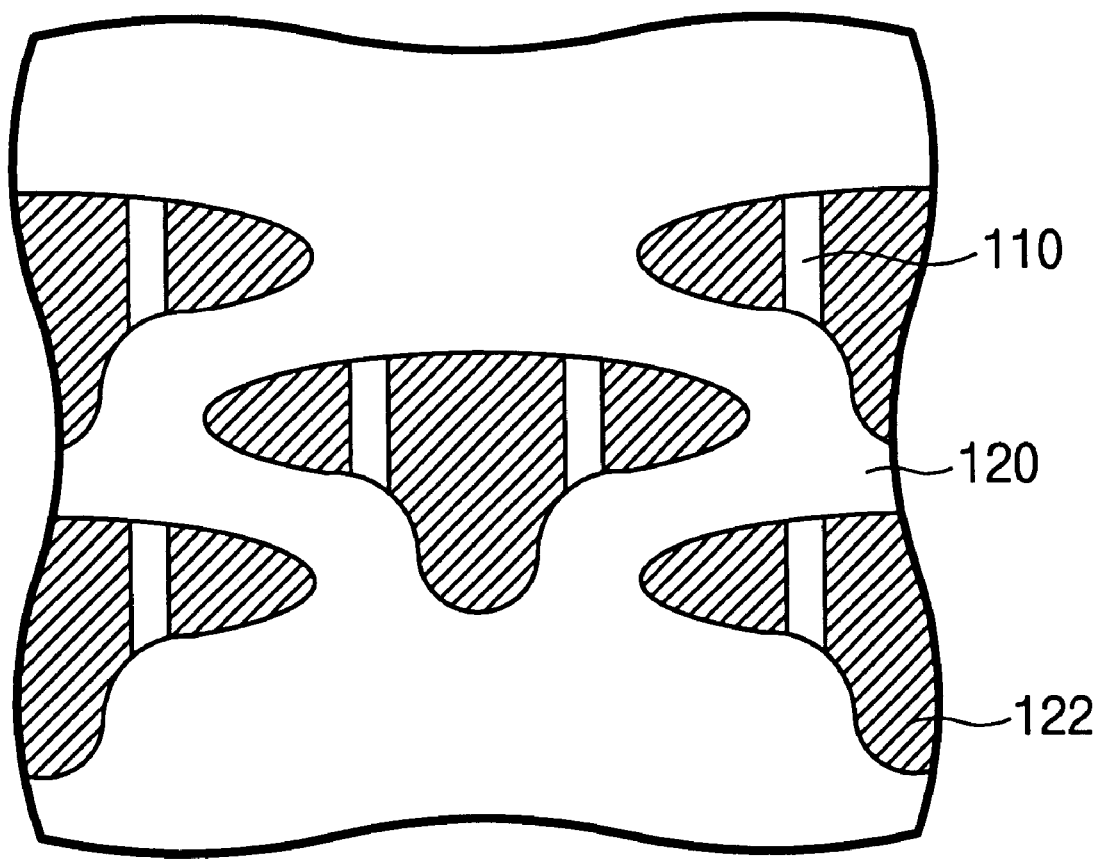
FIG. 7 is a plan view showing a semiconductor substrate where the structure of FIG. 6C is formed.

FIGS. 6A–6C are sectional views sequentially showing a method for fabricating a DRAM device according to a second preferred embodiment of the present invention. FIG. 7 is a plan view showing a semiconductor substrate where the structure of FIG. 6C is formed.

Up to the process of forming the resultant shown in FIG. 3G, the first preferred embodiment and the second preferred embodiment are same, so a description of this portion of the process will be omitted.

Referring to FIG. 6A, the resultant structure from FIG. 3G is subject to an oxide layer isotropic etching process. The sidewalls of the second and fourth insulating layers 110 and 114 and the interlayer insulating film exposed on a lower portion of the photoresist pattern 121 are selectively etched to form a sidewall profile of the second insulating layer 110, which is more recessed than that of the third insulating layer 112 in the opening, or than that of the photoresist pattern 121. In other words, an undercut portion is produced in the in the second insulating layer 110. As mentioned with respect to the first preferred embodiment, the fourth insulating layer 114 is preferably formed with a thickness of about 1000 Å. The lateral dimension of the undercut portion of the second insulating layer is preferably about 300 Å.

In other words, the isotropic etching process is performed until the width of the second insulating layer 112 becomes about 400 Å. If the design rule is reduced below this width, the isotropic etching process is performed until the only minimum thickness of the second insulating layer 112 remains that can insulate pads from one another.

Referring to FIG. 6B, the photoresist pattern 121 is then removed. Afterwards, a conductive layer 124 (for example, a polysilicon layer) is formed over the interlayer insulating film 120 including the opening.

As shown in FIG. 6C, a planarizing process is then performed such that the ratio of the nitride layer to the oxide layer to the polysilicon layer is 1:1:1 down to a top surface of the second insulating layer 110 of the multi-layer contacted with the first and second gate conductive layers 104 and 106. Thus, a pad 122 is formed that is electrically separated from one another by the second insulating layer 110. The planarizing process is preferably performed through a time etching process. In accordance with the second preferred embodiment, the top area of the second insulating layer 110 is undercut by a lateral dimension of about 300 Å, with an overall dimension of about 600 Å. The reduced area of the top insulating layer leads to increases in the top area of the resulting contact pads, which provides a larger alignment tolerance between the contact pad and bit line contact (or capacitor lower electrode contact).

As shown in FIG. 7, the pad 122 is electrically separated from the second insulating layer 110 through the planarizing process.

Figure 1:
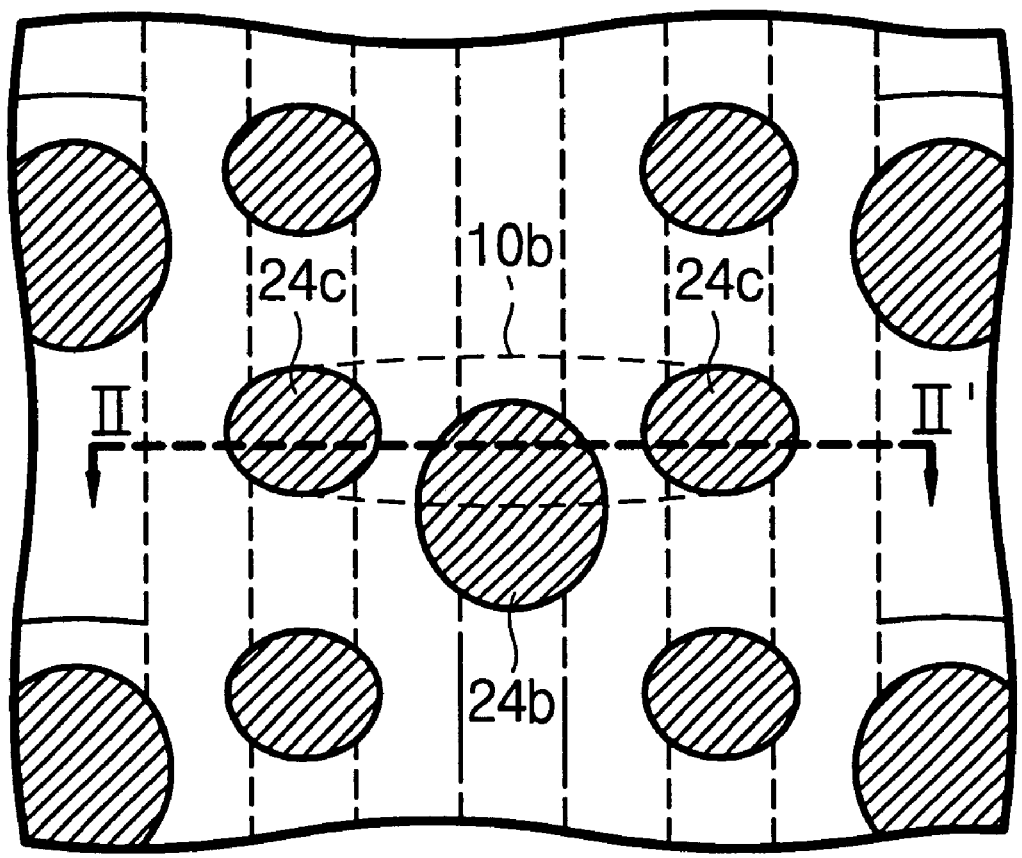
FIG. 1 is a top plan view showing a structure of a self-aligned contact according to a conventional method.
Figure 2A:
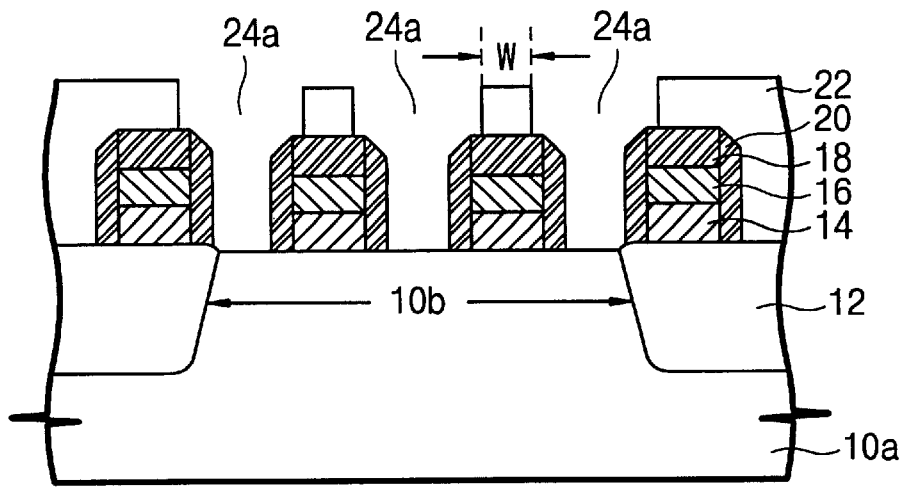
FIGS. 2A–2B are sectional views sequentially showing the process steps of a conventional method for forming a self-aligned contact, taken along a line II–II' of FIG. 1.
Figure 2B:
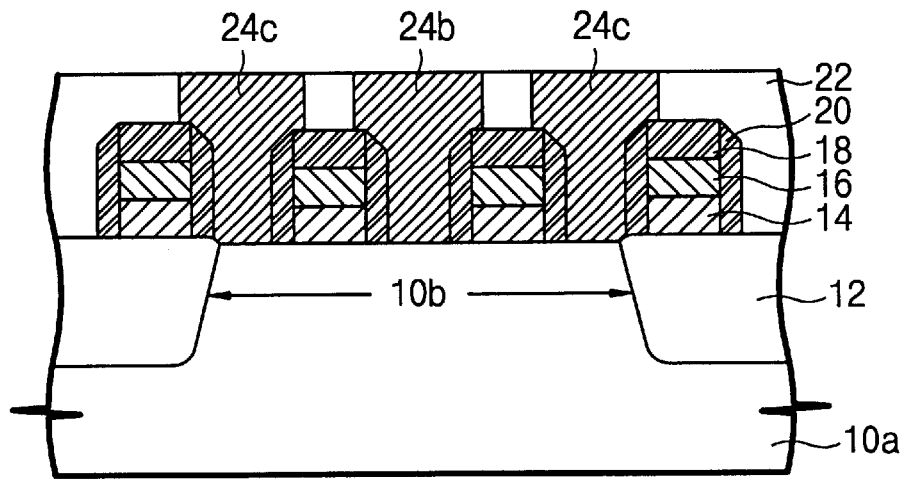

In accordance with the present invention, the contact opening is relatively smaller than is shown in Kohayma et al. above, but is larger than the that of a conventional method shown in FIG. 1. Accordingly, an etch-stop phenomenon can be avoided. Also, self-aligned contact etching can be carried out with a good etching selectivity between the oxide and the nitride. Furthermore, since the oxide layer insulating each contact pad is undercut, the top portion of the resulting contact pad can have an increased area corresponding to an amount of the undercut portion, thereby providing a larger alignment tolerance.

What is claimed is:

1. A method for forming a self-aligned contact of a semiconductor device, comprising:

forming a conductive layer over a semiconductor substrate;

forming a first multiple insulating layer over the conductive layer, the first multiple insulating layer including a first insulating layer and a second insulating layer that has an etching selectivity with respect to the first insulating layer;

forming a second multiple insulating layer over the first multiple insulating layer, the second multiple insulating layer including a third insulating layer and a fourth insulating layer, the third insulating layer having an etching selectivity with respect to both the second and fourth insulating layers;

forming a plurality of gate electrodes by etching the conductive layer, the first multiple insulating layer, and the second multiple insulating layer using a gate electrode formation mask;

forming a spacer on gate sidewalls of the gate electrode, the spacer having an etch selectivity with respect to the fourth insulating layer;

forming an interlayer insulating layer over the semiconductor substrate to fill spaces between the gate electrodes, the interlayer insulating layer having a etching selectivity with respect to the third insulating layer;

etching the interlayer insulating layer until a top surface of the semiconductor substrate between the gate electrodes is exposed, to form an opening;

forming a conductive layer over the interlayer insulating layer and in the opening; and planarizing the conductive layer to form a pad.

2. A method for forming a self-aligned contact of a semiconductor device, as recited in claim 1, further comprising forming a fifth insulating layer over the semiconductor substrate and the gate electrodes subsequent to the forming of the spacer, using a pad formation mask; and etching the interlayer insulating layer until the fifth insulating layer over the semiconductor substrate and adjacent to the gate electrode is exposed.

3. A method for forming a self-aligned contact of a semiconductor device, as recited in claim 2, wherein etching the interlayer insulating layer until a top surface of the semiconductor substrate between the gate electrodes is exposed comprises:

etching the fourth and fifth insulating layers and a portion of the sidewall spacer; and etching a portion of the sidewall spacer exposing a lateral surface of the third insulating layer.

4. A method for forming a self-aligned contact of a semiconductor device, as recited in claim 3, wherein the planarizing of the conductive layer is performed down to a top surface of the third insulating layer.

5. A method for forming a self-aligned contact of a semiconductor device, as recited in claim 2, wherein etching the interlayer insulating layer until a top surface of the semiconductor substrate between the gate electrodes is exposed comprises:

etching the fourth and fifth insulating layers;

etching an upper portion of the spacer to expose sidewalls of the first and second multiple insulating layers; and isotropically etching sidewall portions of the exposed second insulating layer to cause an undercut portion between the first and third insulating layers.

6. A method for forming a self-aligned contact of a semiconductor device, as recited in claim 5, wherein the planarizing of the conductive layer is performed until a top surface of the second insulating layer is exposed.

7. A method for forming a self-aligned contact of a semiconductor device, as recited in claim 5, wherein the isotropic etching of the second insulating layer is performed until a minimum thickness of the second insulating layer is left to insulate the pad from an adjacent pad.

8. A method for forming a self-aligned contact of a semiconductor device, as recited in claim 7, wherein the minimum thickness of the second insulating layer is about 400 Å.

9. A method for forming a self-aligned contact of a semiconductor device, as recited in claim 5, wherein the spacer comprises SiN, and has a thickness of about 300 to 1,000 Å from a sidewall of the gate electrode.

10. A method for forming a self-aligned contact of a semiconductor device, as recited in claim 1, wherein the first and third insulating layers comprise SiN, and the second and fourth insulating layers comprise an oxide.

11. A method for forming a self-aligned contact of a semiconductor device, as recited in claim 1, wherein the first insulating layer has a thickness of about 500 to 1,000 Å, the second insulating layer has a thickness of about 500 to 1,000 Å, the third insulating layer has a thickness of about 500 to 700 Å, and the fourth insulating layer has a thickness of about 300 to 500 Å.

12. A method for forming a self-aligned contact of a semiconductor device, as recited in claim 1, wherein the pad fortmation mask is T-type.

13. A method for forming a self-aligned contact of a semiconductor device, as recited in claim 1, wherein the spacer comprises SiN and has a thickness of about 300 to 1,000 Å from a sidewall of the gate electrode.

14. A method for forming a self-aligned contact of a semiconductor device, comprising:

forming a conductive layer over a semiconductor substrate;

forming a first insulating layer over the conductive layer;

forming a second insulating layer over the first insulating layer;

forming a third insulating layer over the second insulating layer;

forming a fourth insulating layer over the third insulating layer;

forming a gate electrode by etching the conductive layer and the first through fourth insulating layers;

forming a spacer on sidewalls of the gate electrode;

forming a fifth insulating layer over the semiconductor substrate, the gate electrode, and the spacer;

forming an interlayer insulating film over the fifth insulating layer to fill a space between the gate electrode and an adjacent gate electrode;

etching the interlayer insulating layer and the fifth insulating layer between the gate electrode and the adjacent gate electrode to form an opening exposing the semiconductor substrate, wherein an upper portion of the spacer is etched to expose sidewalls of the first and second multiple insulating layer, and sidewall portions of the exposed second insulating layers are isotropically etched to cause an undercut portion between the first and third insulating layers;

forming a conductive layer over the interlayer insulating film and in the opening; and forming a pad by planarizing the conductive layer down to remove any portion outside of the opening.

* * * * *